(12) United States Patent
Aoki et al.

(10) Patent No.: US 6,976,708 B2
(45) Date of Patent: Dec. 20, 2005

(54) FAILURE DIAGNOSTIC SYSTEM FOR SEAT BELT RETRACTOR

(75) Inventors: Hiroshi Aoki, Ritto (JP); Kenji Kitazawa, Hikone (JP)

(73) Assignee: Takata Corporation, Tokyo (JP)

( * ) Notice: Subject to any disclaimer, the term of this patent is extended or adjusted under 35 U.S.C. 154(b) by 247 days.

(21) Appl. No.: 10/440,174

(22) Filed: May 19, 2003

(65) Prior Publication Data
US 2003/0226704 A1    Dec. 11, 2003

(30) Foreign Application Priority Data
Jun. 5, 2002  (JP)  ............................. 2002-164547

(51) Int. Cl.[7] ............................................. B60R 22/34
(52) U.S. Cl. ..................................................... 280/807
(58) Field of Search ......................................... 280/807

(56) References Cited

U.S. PATENT DOCUMENTS 6,257,363 B1 * 7/2001 Midorikawa et al. ....... 180/268

FOREIGN PATENT DOCUMENTS

| GB | 2 335 890 | 10/1999 |
|---|---|---|
| JP | 2001-347922 | 12/2001 |
| JP | 2001-347923 | 12/2001 |
| JP | 2002-87210 | 3/2002 |
| JP | 2002-104135 | 4/2002 |

* cited by examiner

Primary Examiner—Eric Culbreth
(74) Attorney, Agent, or Firm—Manabu Kanesaka

(57) ABSTRACT

A failure diagnostic system detects a failure of a seat belt retractor having a motor for rotating a webbing take-up spool. The failure diagnostic system includes a power supplying device for supplying driving power to the motor for a predetermined period of time; a detecting device for detecting a current or voltage in a wire winding of the motor; and a determining device for determining the failure based on the current or voltage.

11 Claims, 6 Drawing Sheets

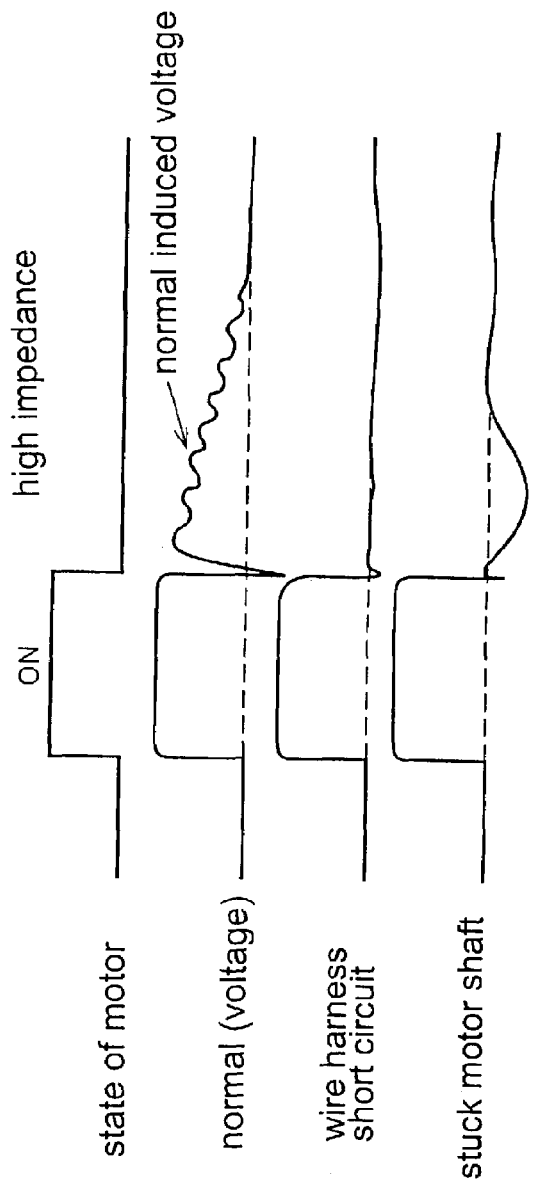

FAILURE DIAGNOSTIC SYSTEM FOR SEAT BELT RETRACTOR

BACKGROUND OF THE INVENTION AND RELATED ART STATEMENT

The present invention relates to a diagnostic system for detecting a failure of a seat belt retractor installed in a vehicle or an automobile. More particularly, the present invention relates to a failure diagnostic system for a seat belt retractor having a motor for rotating a spool around which webbing is wound.

As well known in the art, a seat belt retractor includes a webbing to be unwound to extend along an occupant sitting on a vehicle seat. In case of a vehicle collision, the seat belt retractor locks the webbing from being unwound so as to restrain the occupant.

Among such seat belt retractors, a motorized seat belt retractor has a motor for rotating a webbing take-up spool. There are various types of motorized seat belt retractors, such as a type in which a motor unwinds and winds the webbing and a type in which a motor works only for a pre-tensioning operation (operation of winding a slack of the webbing upon a collision or collision prediction). It should be noted that the present invention could be applied to any type of seat belt retractors.

It is an object of the present invention to provide a failure diagnostic system for the seat belt retractor for reliably detecting a failure of a motor in the seat belt retractor while the occupant feels no or little discomfort.

Further objects and advantages of the invention will be apparent from the following disclosure of the invention.

SUMMARY OF THE INVENTION

According to the present invention, a failure diagnostic system detects a failure of a seat belt retractor having a motor for rotating a webbing take-up spool. The failure diagnostic system includes power supplying means for supplying driving power to the motor for a predetermined period of time; detecting means for detecting a current or voltage in a wire winding of the motor; and determining means for determining the failure based on the current or voltage.

In the failure diagnostic system of the present invention, the motor is driven for a short period of time (preferably 100 msec or less) and the current or voltage is detected so as to determine the failure based on the current or voltage. The motor needs to wind or unwind only a small amount of the webbing for the diagnosis. Therefore, even when an occupant wears the seat belt, the occupant does not feel any change in tension of the webbing, thereby preventing the occupant from feeling discomfort.

In the present invention, the failure diagnosis is conducted by driving the motor for a short period of time. Thus, the diagnosis can be conducted at any time when a vehicle is in a predetermined operational state, thereby making it possible to detect a failure early or in advance.

The "predetermined operational state" includes, for example, an operation of turning on an ignition switch, latching a tongue of the seal belt to a buckle, or unlatching the tongue from the buckle.

The failure diagnostic system of the present invention may not be conducted when the buckle is in the latched state. With such an arrangement, when the occupant wears the seat belt, the diagnosis is not executed, thereby preventing the occupant from feeling any discomfort.

According to the present invention, the motor may be arranged to rotate in a direction of unwinding the webbing for the diagnosis. With such an arrangement, the webbing slightly slacks relative to the occupant during the diagnosis so that the occupant does not feel any discomfort.

According to the present invention, the failure diagnostic system may be arranged to control a motor speed by applying a current between both terminals of the motor after the diagnosis. With such an arrangement, it is possible to securely prevent the webbing from excessively slacking or from excessively tightening the occupant.

According to the present invention, the failure diagnostic system may be arranged to rotate the motor in the reverse direction after the diagnosis, to unwind the webbing in a condition prior to the diagnosis. With such an arrangement, it is possible to automatically return the webbing to an original state, thereby making the occupant feel comfortable.

According to the present invention, the failure diagnostic system may be arranged to repeat the diagnosis predetermined times when the first diagnosis indicates an abnormal condition. With such an arrangement, it is possible to improve the accuracy of the diagnosis. In the repeated diagnoses, the failure diagnostic system may change a condition of supplying the power to increase the driving force of the motor. For example, the motor is driven to rotate at a lower torque for the first diagnosis and the torque is gradually increased after the first diagnosis.

Further, it is possible to reduce an operational noise generated from a transmission or the motor by supplying a small current/voltage to the motor to reduce the driving force of the motor and the operational speed of the motor. Accordingly, the occupant does not notice the noise, thereby preventing the occupant from feeling discomfort.

According to the present invention, the detecting means for detecting the motor rotation may include sequence for temporally making the wire winding of the motor be in a high impedance state, in conjunction with the motor drive controlling means, after the wire winding of the motor is driven in a low impedance state, and detecting means for detecting an induced voltage (induced current) in the wire winding of the motor in synchronization with the sequence. The detecting means determines the rotation of the motor, the polarity the rotation, or the speed of the motor according to a magnitude of the induced voltage and its polarity. Since the induced voltage (current) is increased in proportion to an increase in the rotational speed of the rotor, a large voltage is generated in the high impedance state, thereby facilitating the determination.

The motor rotation detecting means may comprise detecting means for detecting a variation in a current (or mean current in a short distance) in the wire winding of the motor with time, in conjunction with the motor drive controlling means, while the motor is driven in the low impedance state. The detecting means determines the rotation of the motor, the polarity of the rotation of the motor, or the rotational speed of the motor according to a magnitude of the induced voltage and its polarity. Since the current decreases with the rotation of the rotor, the rotation can be detected while the motor is driven.

The failure diagnostic system may be arranged to conduct the diagnosis by oscillating the rotor, not rotating the rotor in one direction, by repeating normal rotation and reverse rotation for a very short period of time. In this case, a cycle of reverse rotation, rotation detection, and normal rotation can be repeated for a short period of time so as to increase the oscillation, thereby improving the reliability in the rotation detection.

BRIEF DESCRIPTION OF THE DRAWINGS

FIG. 4 is a chart for explaining an operation of a motor;

FIG. 5 is a chart for showing waveforms of an induced voltage;

PREFERRED EMBODIMENTS OF THE INVENTION

Figure 1:
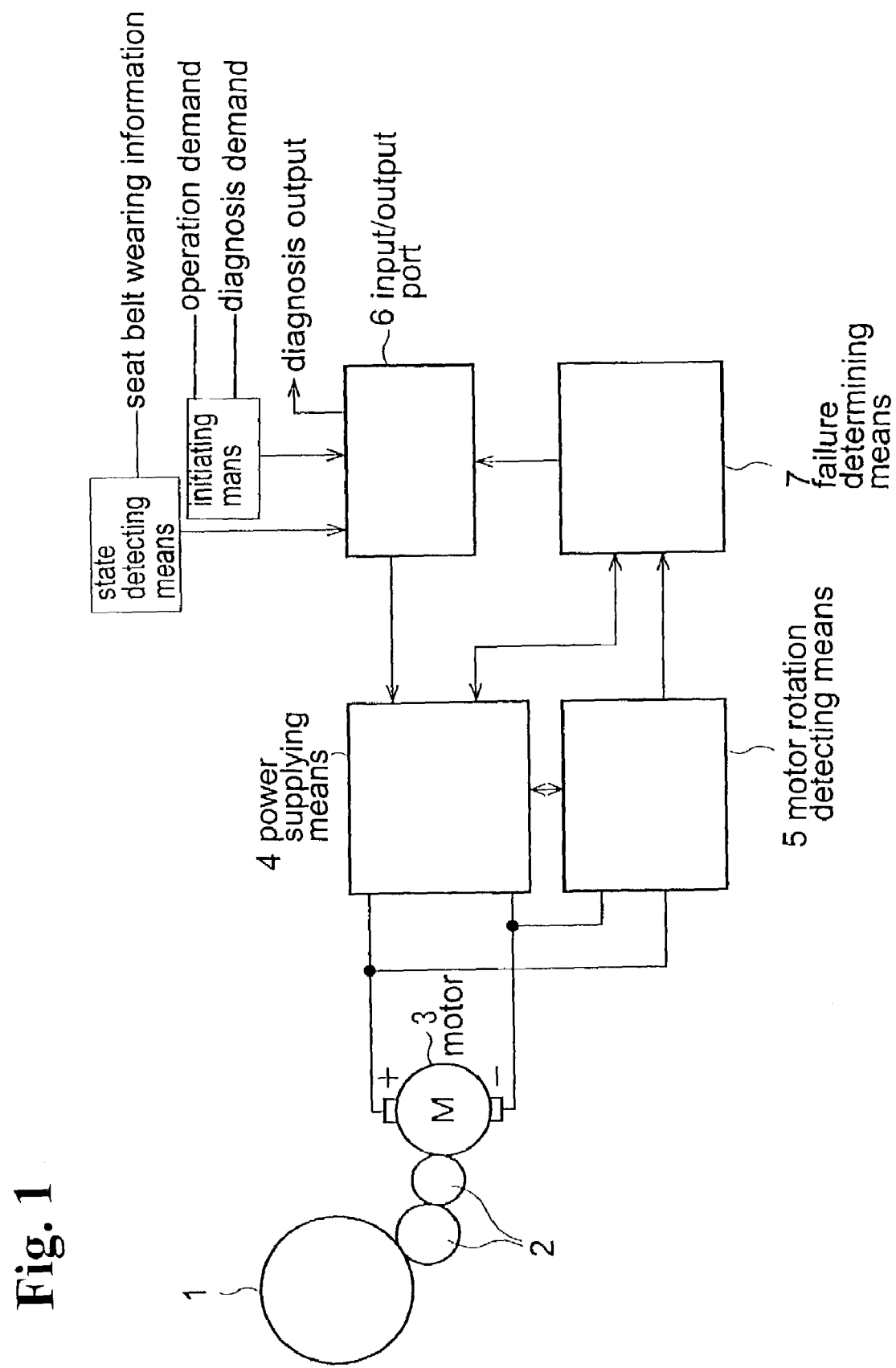
FIG. 1 is a block diagram for showing a failure diagnostic system for a seat belt retractor according to an embodiment of the present invention.
Figure 2:
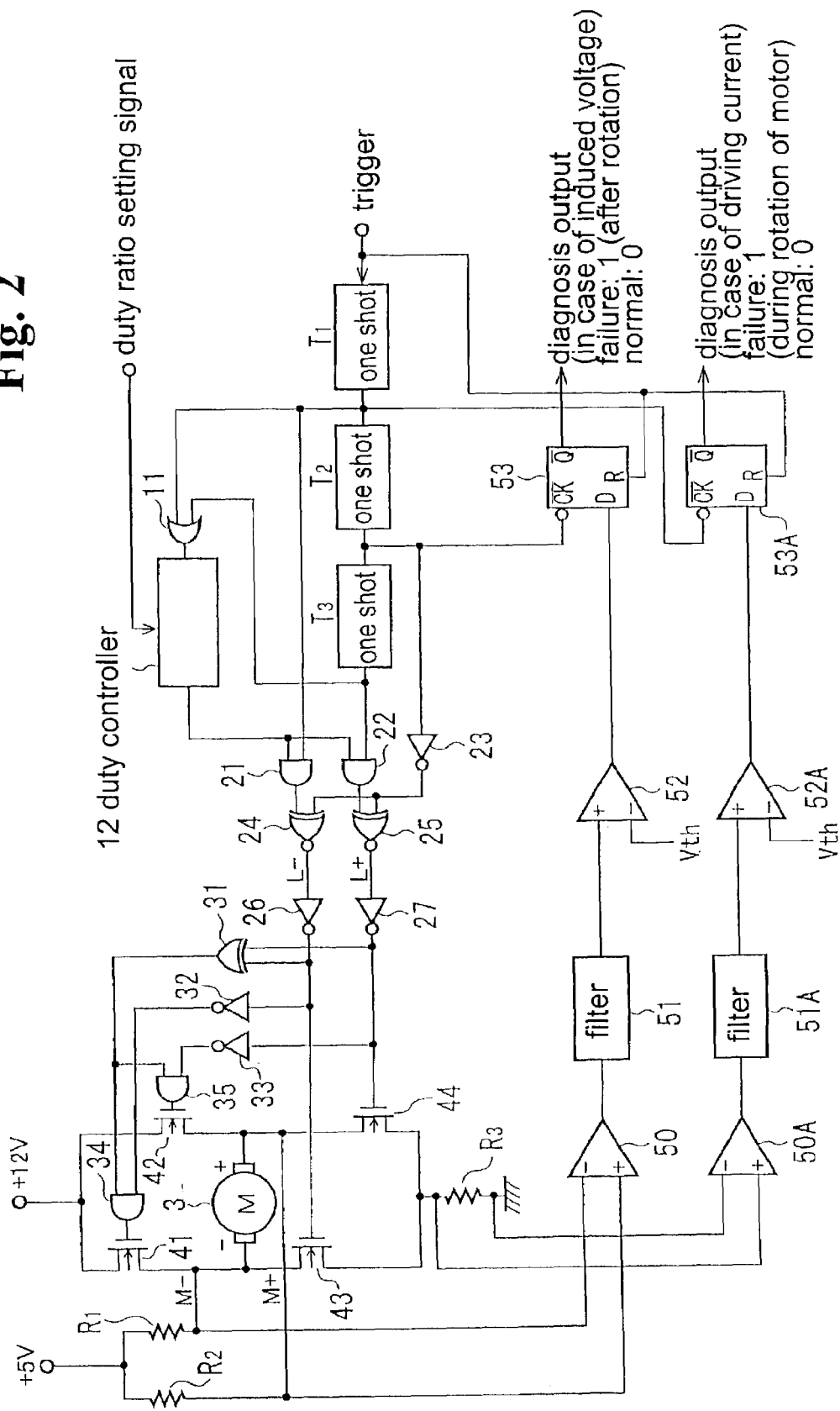
FIG. 2 is a circuit diagram of the failure diagnostic system for a seat belt retractor according to the embodiment.
Figure 3:
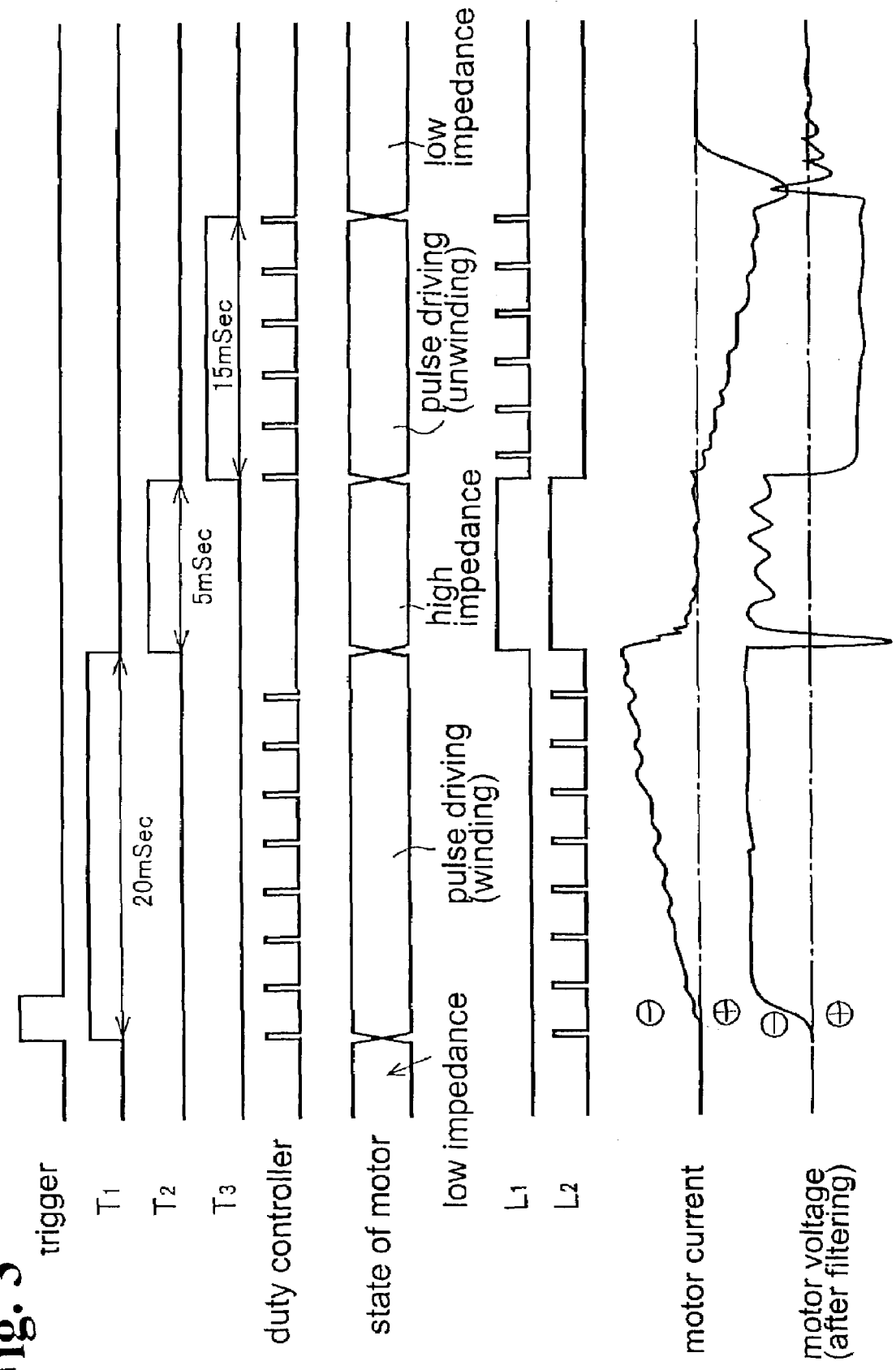
FIG. 3 is a timing chart of the failure diagnostic system for a seat belt retractor according to the embodiment.
Figure 6:
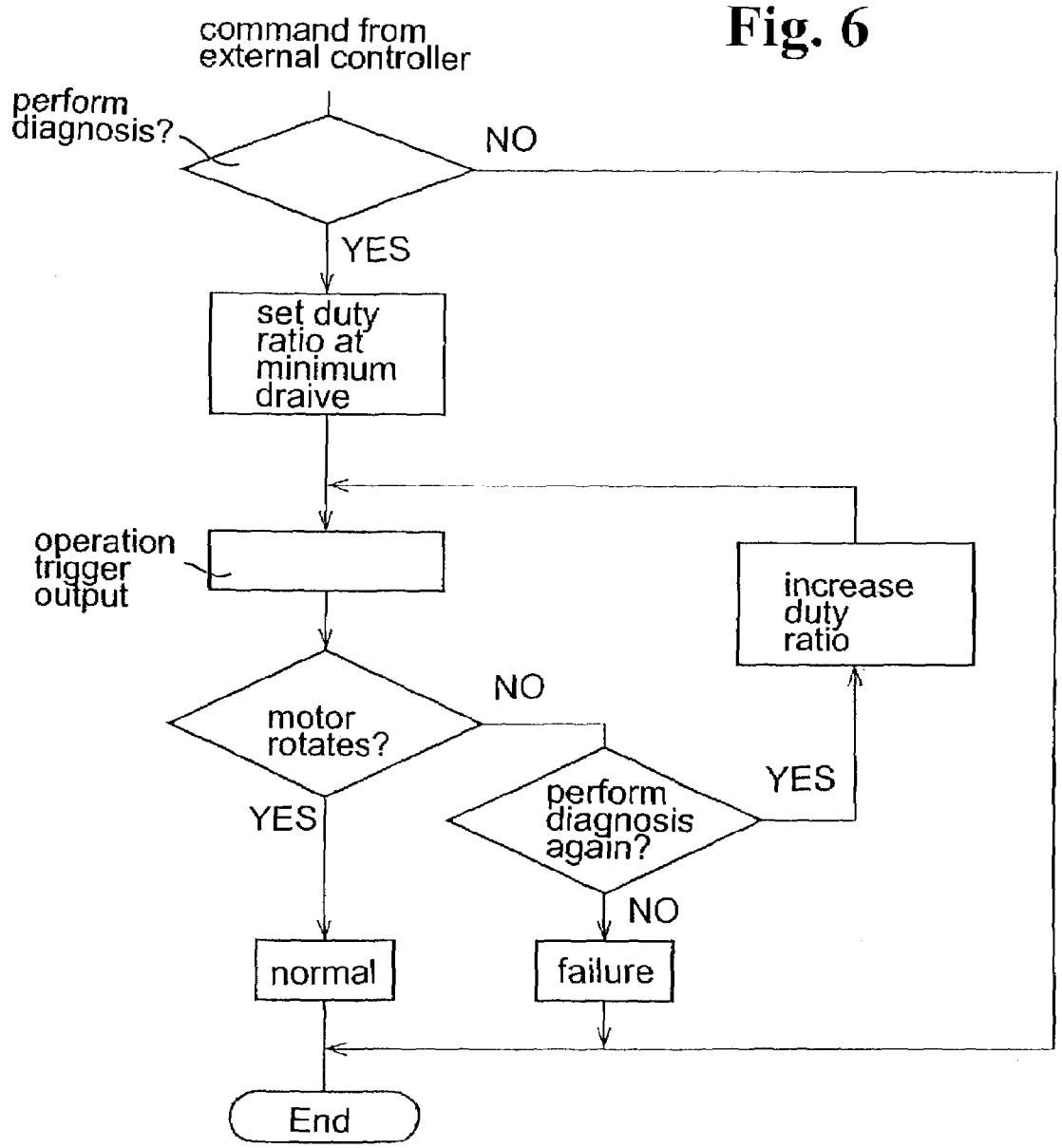
FIG. 6 is a flow chart for showing an example of a controlling operation.
Figure 7:
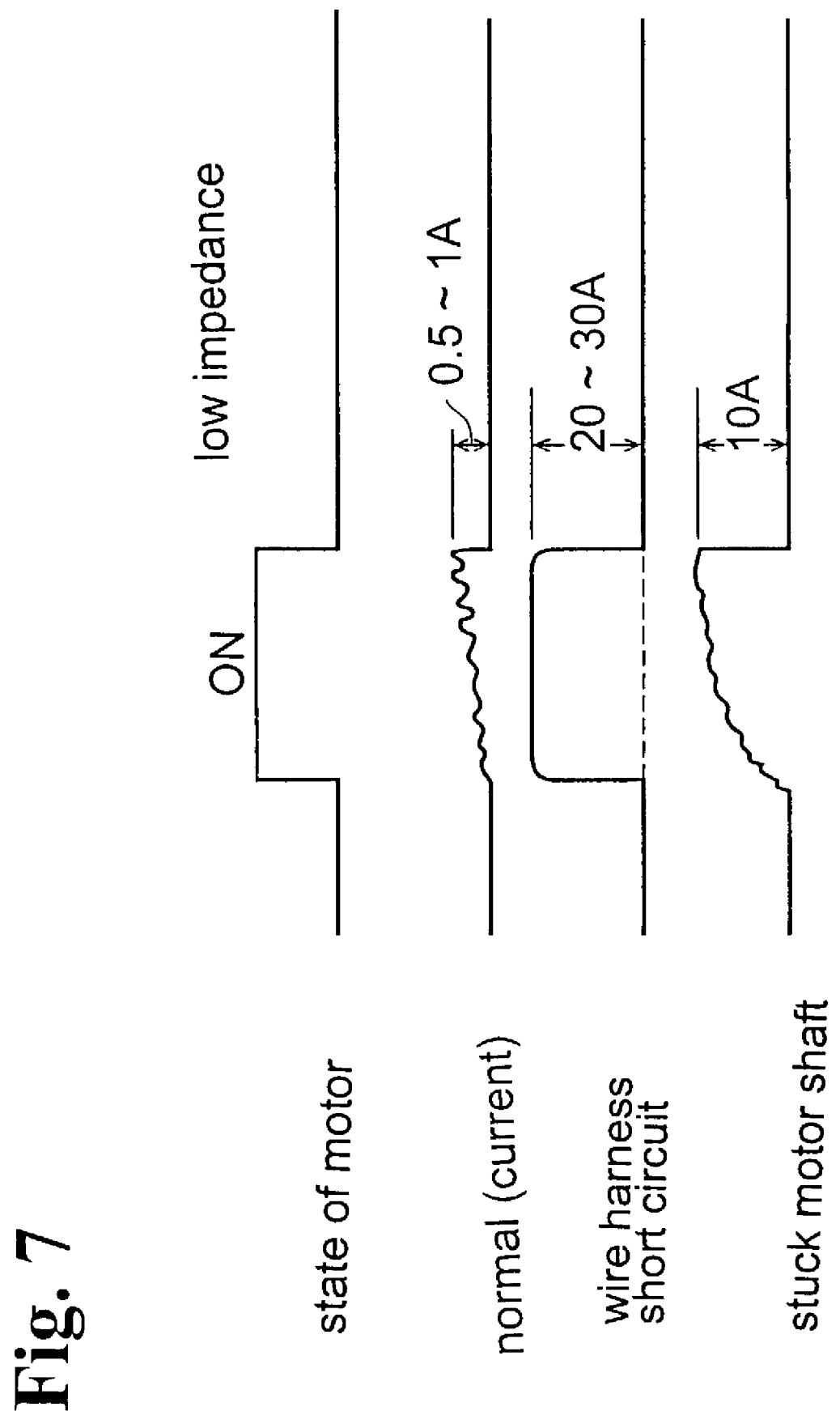
FIG. 7 is a chart for showing waveforms of a current.

Hereunder, embodiments of the invention will be described with reference to the accompanying drawings. FIG. 1 is a block diagram showing a failure diagnostic system for a seat belt retractor according to an embodiment of the present invention, FIG. 2 is a circuit diagram of the failure diagnostic system for a seat belt retractor according to the embodiment, FIG. 3 is a timing chart of the failure diagnostic system for a seat belt retractor according to the embodiment, FIG. 4 is a chart for explaining an operation of a motor, FIG. 5 is a chart showing waveforms of an induced voltage, FIG. 6 is a flow chart showing an example of a controlling operation, and FIG. 7 is a chart showing waveforms of a current in a diagnosis example.

As shown in FIG. 1, a motor 3 is connected to a webbing take-up spool 1 of a seat belt retractor via a clutch mechanism 2. The motor 3 is used only for pre-tensioning in this embodiment, but the present invention is not limited thereto as mentioned in the background of the invention.

The clutch mechanism 2 comprises gears engaging through a driving force of the motor 3 when the motor 3 rotates (the rotational direction may be either the forward rotation or the reverse rotation). Such a gear-type clutch mechanism is well known in the art, as disclosed in Japanese Patent Publications No. 2001-347922, No. 2001-347923, and No. 2002-104135.

The motor 3 is driven according to power supplying means 4 or motor drive controlling means, and an operational command or a diagnosis command is sent to the motor drive controlling means through an input/output port 6.

Motor rotation detecting means 5 detects a current or voltage (FIG. 5) induced by the motor 3 after stop of driving the motor. The detected data is supplied to failure determining means 7 for the failure diagnosis. A result of the failure diagnosis is output through the input/output port 6.

Circuit configurations of the motor drive controlling means 4, the motor rotation detecting means 5, and failure determining means 7 will be described with reference to FIG. 2 and FIG. 3.

The diagnosis command signal is input as a trigger signal to a one-shot circuit T1 from the input/output port 6. An output signal T1 of the one-shot circuit T1 becomes 1 for a predetermined period of time (e.g. 20 msec). When the signal T1 of the one-shot circuit drops from 1 to 0, an output of a one-shot circuit T2 becomes 1 for a predetermined period of time (e.g. 5 msec). When the signal T2 of the one-shot circuit drops from 1 to 0, an output of a one-shot circuit T3 becomes 1 for a predetermined period of time (e.g. 15 msec).

A logical sum (i.e. "OR") of the signals T1, T3 is input to a duty controller 12 through an OR gate 11. The duty controller 12 outputs pulse signals of a predetermined duty ratio at a constant frequency according to a specific duty ratio setting signal. The duty ratio of a diagnostic operation is controlled to reduce the driving force for the diagnosis. A logical product (i.e. "AND") of an output of the duty controller 12 and the signal T1 is sent to an EXNOR gate 24 through an AND gate 21. An inversion signal of the signal T2 is also sent to the EXNOR gate 24 through an inverter 23. Their exclusive logical sum OR becomes a motor driving signal L−.

A logical product of the output of the duty controller 12 and the signal T3 is sent to an EXNOR gate 25 through an AND gate 22. An inversion signal of the signal T2 is also sent to the EXNOR gate 25. Their exclusive logical sum OR becomes a motor driving signal L+.

The respective inversion signals of the signals L− and L+ through inverters 26, 27 are input to an EXOR gate 31. An output of the EXOR gate 31 is input to AND gates 34 and 35. An output signal of the inverter 26 is input to a gate of an enhancement-type FET 43 and also to the AND gate 34 through an inverter 32. An output signal of the inverter 27 is input to a gate of an enhancement-type FET 44 and also to the AND gate 35 through an inverter 33. An output of the AND gate 34 is input to a gate of an enhancement-type FET 41 and an output of the AND gate 35 is input to a gate of an enhancement-type FET 42.

The FETs 41 and 42 have drains connected to a power source line of +12 V. A source of the FET 41 is connected to a negative terminal of the motor 3 and also to a drain of the FET 43. A source of the FET 42 is connected to a positive terminal of the motor 3 and also to a drain of the FET 44. The FETs 43, 44 have sources connected to ground via a resistor R3.

Both terminals of the motor 3 are connected to each other via resistors R1, R2, and a connecting point between the resistors R1, R2 is connected to a bias line of +5 V. A voltage potential difference between the terminals of the motor 3 is amplified by an operational amplifier 50 and is compared to a threshold voltage value Vth at a comparator 52 via a filter 51. An output of the comparator 52 is input to a D terminal of a D-type flip-flop 53. The trigger signal is input to an R terminal of the D-type flip-flop 53, and the signal T2 is input to a clock terminal CK of the flip-flop 53. An inversion output is output as a diagnosis output to the input/output port.

As shown in FIG. 2 and FIG. 4, when L+ is 1 and L− is 0, the FETs 42, 43 are ON and the FETs 41, 44 are OFF so that the motor rotates in the forward direction so as to slightly unwind the webbing. On the other hand, when L+ is 0 and L− is 1, the FETs 42, 43 are OFF and the FETs 41, 44 are ON so that the motor rotates in the reverse direction.

When L+ and L− are both 1, the FETs 41 through 44 are OFF. Hereinafter, this state is called "high impedance". When L+ and L− are both 0, only the FETs 43, 44 are ON and both terminals of the motor 3 are electrically connected (hereinafter, this state is called "low impedance").

As shown in FIG. 3, when the trigger signal is sent, the signal T1 becomes 1 for a predetermined period of time (in this embodiment, 20 msec). During this period of time, an L+ signal in a pulse shape is output at a duty ratio set by the duty controller 12 so that the rotor of the motor rotates. After a lapse of 20 msec, the signal T1 returns to 0 and the signal T2 becomes 1 so that the FETs 41 through 44 are OFF. That is, the motor is in the high impedance state. During this period of time, the rotor of the motor 3 continues to rotate by inertia thereof so as to generate an induced voltage. A voltage potential difference is amplified by the operational amplifier 50 and is compared to a threshold value at the comparator 52. When the motor 3 is normal, an output voltage of the operational amplifier 50 is higher than the threshold value. Also, an output of the comparator 52 is 1 and the signal 0 (normal signal) is output from the reversal output terminal of the D-type flip-flop 53.

In case the motor 3 is failed, for example, when a harness of the motor 3 becomes short-circuit or the rotor does not rotate due to a stuck motor shaft, only a small voltage is induced in the high impedance period after stop driving of the motor, i.e. supply of electricity to the motor is stopped. Thus, an output of the comparator 52 is 0 and the output from the reversal output terminal of the D flip-flop 53 is 1 indicating the failure.

As shown in FIG. 3, the high impedance state ends when the signal T2 drops to 0 and, in turn, the signal T3 jumps to 1. This state (L+ is 0 and L– is 1) is maintained for 15 msec. During this period of time, the motor 3 rotates in the reverse direction so as to wind up the webbing. After that, the signal T3 drops, thus returning to the initial state.

According to the present invention, when the failure is determined by the diagnosis shown in FIG. 1, the failure diagnostic operation may be conducted once or repeated several times. FIG. 6 shows an example of a control of the diagnosis.

As shown in FIG. 6, when the diagnosis command is input from an outside controller, the duty ratio is set to be the minimum value in the duty controller 12. Then, the operational trigger is sent so as to conduct the diagnosis. When the result of the diagnosis indicates a normal condition, the diagnostic operation is conducted only once and stops (it should be noted that the operation may be conducted several times even in this case). When the result of the diagnosis indicates a failure, the duty ratio is increased to increase the motor torque. In this state, the diagnostic operation is repeated. In a case that the result still indicates a failure when the duty ratio reaches an upper limit after a predetermined number of repetition, it is determined that there is indeed a failure. It should be noted that when the result of the repeated diagnosis indicates a normal condition, it is determined that it is normal and no further diagnosis is conducted.

Since the duty ratio for the first operation is set to be small, the amount of winding and unwinding the webbing is so small and the noise generated during the operation is also small. Therefore, the diagnosis can be done while the occupant does not feel any discomfort. Instead of changing the duty ratio, the current or voltage for driving the motor may be changed.

The failure diagnosis may be conducted, for example, within 10 seconds after the start of ignition. Alternatively, the diagnosis may be conducted when a buckle is latched. On the contrary, the diagnosis may not be conducted when the occupant wears the seat belt, and then conducted any time, for instance, when the buckle is unlatched.

The rotational direction of the motor during the diagnosis may be the webbing unwinding direction just like the aforementioned embodiment. Alternatively, the direction may be the webbing winding direction. In a case of the webbing unwinding direction, the webbing slightly slacks for the unwound amount so that, even when an occupant wears the seat belt, the occupant does not feel any discomfort.

The motor rotates for the diagnosis corresponding to one pole of the rotor (in a case of a motor having five poles, 1/5 or more rotation). A preferred period of time is 100 msec or less, more preferably in a range of 1 to 10 msec. The rotation of the motor for the diagnosis is preferably 0.1 to 2 but not limited thereto.

In the case of rotating the motor in the webbing unwinding direction, the tension on the belt is not increased so that the rotation is preferably in a range of 1–20 rotations. In a case that the clutch mechanism of the spool is connected when the motor 3 rotates, the motor 3 may rotate in a range of 1–5 rotations so that the clutch is released, thereby performing the diagnosis and returning the clutch to the initial state at the same time.

According to the present invention, in the case that the motor rotates in a direction for operating the clutch mechanism, the motor may rotate in a range of 0.1–2 rotations within a play where the power is not supplied. Accordingly, the diagnosis of the motor can be conducted without rotating the spool.

After the motor rotation detection for the diagnostic is completed, the state may return to the low impedance state where the FETs 43, 44 are ON, thereby putting brake on the motor.

Though a DC motor is a commonly used in the aforementioned embodiment, the motor is not limited thereto and a DC brush-less motor or a step motor may be used.

In the present invention, it is possible to perform the diagnosis during supplying the power without stopping the power. In this case, as shown in FIG. 2, the comparator 52A compares a voltage at both terminals of the resistor R3 through an operational amplifier 50A and a filter 51A. According to the result of the comparator 52A, a diagnostic output is output from a flip-flop 53A. The resistor R3 is preferably in a range of 0.1–0.01 Ω. FIG. 7 shows an example of the diagnostic operation during the power supply.

As described above, the present invention provides the failure diagnostic system for the seat belt retractor that can reliably detect the failure of the motor of the seat belt retractor while the occupant feels no or little discomfort.

While the invention has been explained with reference to the specific embodiments of the invention, the explanation is illustrative and the invention is limited only by the appended claims.

What is claimed is:

1. A failure diagnostic system for detecting a failure of a seat belt retractor having a motor for rotating a webbing take-up spool, comprising:

state detecting means for detecting an operational state of a vehicle, initiating means electrically connected to the state detecting means for initiating a diagnostic operation or holding the diagnostic operation based on a signal from the state detecting means, power supplying means electrically connected to the initiating means and the motor, said power supplying means, upon receiving an initiation signal from the initiation means, supplying a driving current or voltage to the motor for a predetermined period of time, detecting means electrically connected to the motor and the power supplying means for detecting a current or voltage in a wire winding of the motor, and determining means electrically connected to the power supplying means and the detecting means for determining the failure based on the current or voltage detected by the detecting means.

2. A failure diagnostic system as claimed in claim 1, wherein said state detecting means detects one of a state where an ignition switch of a vehicle is turned on, a state where a tongue of a seat belt is latched to a buckle, and a state where the tongue of the seat belt is released from the buckle.

3. A failure diagnostic system as claimed in claim 2, wherein said initiating means is arranged to hold the diagnostic operation when the state detecting means detects the state where the tongue of the seat belt is latched to the buckle.

4. A failure diagnostic system as claimed in claim 1, wherein said power supplying means supplies the driving current or voltage to the motor to rotate in a direction of unwinding a webbing on the webbing take-up spool.

5. A failure diagnostic system as claimed in claim 1, wherein said power supplying means is arranged to supply the driving current or voltage to the motor for 100 msec or less.

6. A failure diagnostic system as claimed in claim 1, wherein said power supplying means is arranged to apply brake on the motor after the determining means completes diagnosis.

7. A failure diagnostic system as claimed in claim 1, wherein in conducting the diagnostic operation, said power supplying means supplies the driving current or voltage smaller than a current or voltage for normally rotating the webbing take-up spool.

8. A failure diagnostic system as claimed in claim 1, wherein said state detecting means detects a state where an ignition switch of a vehicle is turned on so that the initiating means starts the diagnostic operation.

9. A failure diagnostic system for detecting a failure of a seat belt retractor having a motor for rotating a webbing take-up spool, comprising:

power supplying means electrically connected to the motor for supplying a driving current or voltage to the motor for a predetermined period of time, detecting means electrically connected to the motor and the power supplying means for detecting a current or voltage in a wire winding of the motor, and determining means electrically connected to the power supplying means and the detecting means for determining the failure based on the current or voltage detected by the detecting means, wherein said power supplying means is arranged to rotate the motor in a reverse direction so that the webbing take-up spool returns to an original state after the determining means completes diagnosis.

10. A failure diagnostic system for detecting a failure of a seat belt retractor having a motor for rotating a webbing take-up spool, comprising:

power supplying means electrically connected to the motor for supplying a driving current or voltage to the motor for a predetermined period of time, detecting means electrically connected to the motor and the power supplying means for detecting a current or voltage in a wire winding of the motor, and determining means electrically connected to the power supplying means and the detecting means for determining the failure based on the current or voltage detected by the detecting means, wherein said power supplying means is arranged to repeat supplying the driving current or voltage to the motor for predetermined times when the determining means initially detects an abnormal condition.

11. A failure diagnostic system as claimed in claim 10, wherein said power supplying means is arranged to increase the driving current or voltage to the motor to increase a driving force of the motor when the power supplying means repeats supplying the driving current or voltage to the motor.

* * * * *